United States Patent
Arami et al.

[11] Patent Number: 5,904,872
[45] Date of Patent: May 18, 1999

[54] HEATING DEVICE, METHOD OF MANUFACTURING THE SAME, AND PROCESSING APPARATUS USING THE SAME

[75] Inventors: Junichi Arami; Kenji Ishikawa, both of Sagamihara; Harunori Ushikawa, Gunma; Isao Yanagisawa, Gunma; Nobuo Kawada, Gunma; Hiroshi Mogi, Gunma, all of Japan

[73] Assignees: Tokyo Electron Limited; Shin-Etsu Chemical Co., Ltd., both of Tokyo, Japan

[21] Appl. No.: 08/534,312

[22] Filed: Sep. 27, 1995

[30] Foreign Application Priority Data

Sep. 29, 1994 [JP] Japan .................................. 6-261950
Mar. 15, 1995 [JP] Japan .................................. 7-083363

[51] Int. Cl.$^6$ .............................. H05B 3/68; H05B 3/00; C23C 16/00
[52] U.S. Cl. ......................... 219/465; 219/544; 427/592; 29/611
[58] Field of Search ................... 219/464, 465, 219/467, 543, 544; 427/592, 593; 29/620, 621, 610.1, 611

[56] References Cited

U.S. PATENT DOCUMENTS

| | | | |
|---|---|---|---|
| 2,007,111 | 7/1935 | Morgan | 219/465 |
| 2,179,934 | 11/1939 | Jones | 219/465 |
| 2,409,244 | 10/1946 | Bilan | 219/465 |
| 2,640,906 | 6/1953 | Haynes | 219/465 |
| 2,799,765 | 7/1957 | Jenkins et al. | 219/465 |
| 3,110,795 | 11/1963 | Bremer | 219/465 |
| 4,057,707 | 11/1977 | Allen | 219/464 |
| 4,357,526 | 11/1982 | Yamamoto et al. | 219/544 |
| 4,527,050 | 7/1985 | Kicherer | 219/464 |
| 4,615,755 | 10/1986 | Tracy et al. | 156/345 |
| 4,733,056 | 3/1988 | Kojima et al. | 219/543 |
| 4,960,978 | 10/1990 | Lorenz et al. | 219/465 |
| 5,151,871 | 9/1992 | Matsumura et al. | 219/464 |
| 5,225,663 | 7/1993 | Matsumura et al. | 219/468 |
| 5,227,610 | 7/1993 | Schulthesis et al. | 219/449 |

FOREIGN PATENT DOCUMENTS 63-91382  11/1988  Japan .
5 36470   2/1993  Japan .

*Primary Examiner*—Teresa Walberg
*Assistant Examiner*—Sam Paik
*Attorney, Agent, or Firm*—Oblon, Spivak, McClelland, Maier & Neustadt, P.C.

[57] ABSTRACT

A heating device is formed by a heating plate formed of silica and having a heating surface for heating an object to be heated, a heating element having a predetermined pattern and fixed to a surface opposing the heating surface of the heating plate, and a reflecting plate formed of silica and brought into tight contact with the surface of the heating plate on which the heating element is formed. This heating device is arranged in a processing vessel in a CVD apparatus, and a semiconductor wafer is placed on the heating device. A process gas is supplied into the processing vessel while the semiconductor wafer is heated, thereby forming a predetermined film on the semiconductor wafer.

44 Claims, 6 Drawing Sheets

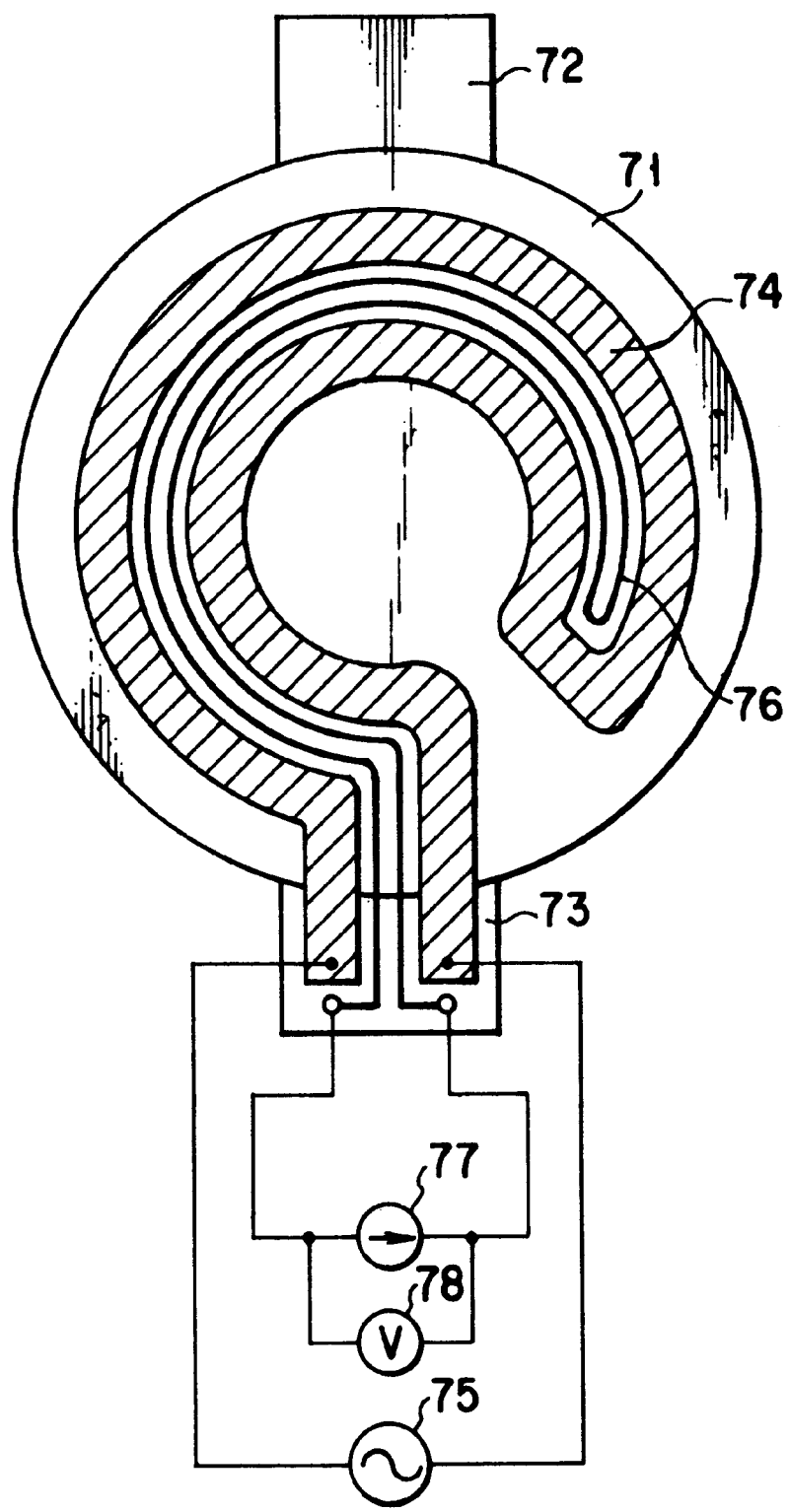
F I G. 14

HEATING DEVICE, METHOD OF MANUFACTURING THE SAME, AND PROCESSING APPARATUS USING THE SAME

BACKGROUND OF THE INVENTION

1. Field of the Invention

The present invention relates to a heating device suitable for the process of manufacturing a semiconductor device, a method of manufacturing the heating device, and a processing apparatus using the heating device.

2. Description of the Related Art

In the process of manufacturing a semiconductor device, when surface processing for a semiconductor wafer on which devices are formed, for example, etching processing or CVD processing, is to be performed, a semiconductor wafer serving as an object to be processed is placed on a susceptor arranged in a processing vessel designed to have airtightness, and the processing vessel is evacuated to a predetermined low-pressure atmosphere. A predetermined process gas is supplied into the processing vessel. In this manner, predetermined processing is performed.

In this case, heating a semiconductor wafer to a predetermined temperature to perform predetermined processing has been conventionally used. A heating device for heating a semiconductor wafer is generally incorporated in the susceptor. A conventional heating device comprises a heating plate formed of a ceramic material such as $Al_2O_3$ or AlN and a heating element formed of tungsten, and has a structure in which the heating element is simply inserted in a groove formed in a ceramic material in correspondence with the pattern of the heating element.

However, in the conventional heating device, $Al_2O_3$ or AlN constituting the heating plate tends to form particles, so that contamination may occur in a processing vessel or on a semiconductor wafer. Since the inner surface of the processing vessel is exposed to various etching gas atmospheres, corrosion must be considered. However, the above ceramic material does not necessarily have a satisfactory resistance to corrosion. In addition, since the ceramic material has a low thermal shock resistance, the ceramic material cannot be abruptly increased or decreased in temperature, and must be used in a steady state. Since the heating device has the heating element simply inserted into the patterned groove, the heating element may be cluttered in the patterned groove, and particles may be formed by the cluttered heating element.

A degree of vacuum in the processing vessel is set to be high, for example, 1 Torr or less. At the high degree of vacuum, the dielectric breakdown level of a gas, i.e., a discharge start voltage level, is lowered, and discharge tends to occur. For this reason, there is no power supply method effective in the processing vessel, and a power supply path extending through the susceptor from the atmospheric side of the processing vessel must be formed. Therefore, this power supply path poses a problem on design for the heating device and maintenance.

SUMMARY OF THE INVENTION

It is an object of the present invention to provide a heating device, for heating an object such as a semiconductor wafer, which is excellent in resistance to corrosion, does not form particles which cause contamination, and can abruptly increase or decrease a temperature.

It is another object of the present invention to provide a heating device in which an effective supply of power from the atmospheric side can be performed.

It is still another object of the present invention to provide a method of manufacturing the heating device.

It is still another object of the present invention to provide a processing apparatus in which the heating device is incorporated.

According to the first aspect of the present invention, there is provided a heating device comprising:
 a heating plate formed of silica and having a heating surface for heating an object to be heated; and
 a heating element having a predetermined pattern and fixed to a surface of the heating plate which opposes the heating surface.

According to the second aspect of the present invention, there is provided a heating device comprising:
 a heating plate formed of silica and having a heating surface for heating an object to be heated;
 a heating element having a predetermined pattern and fixed to a surface of the heating plate which opposes the heating surface; and
 a reflecting plate formed of silica and brought into tight contact with the surface of the heating plate on which the heating element is formed.

According to the third aspect of the present invention, there is provided a method of manufacturing a heating device, comprising the steps of:
 preparing a heating plate formed of silica and having a heating surface for heating an object to be heated;
 forming a recessed portion corresponding to a pattern of a heating element in the surface of the heating plate which opposes the heating surface;
 filling a paste containing a heat generating component in the recessed portion; and
 sintering the paste to form the heating element.

According to the fourth aspect of the present invention, there is provided a method of manufacturing a heating device, comprising the steps of:
 preparing a heating plate formed of silica and having a heating surface for heating an object to be heated;
 applying a paste containing a heat element component to a surface of the heating plate which opposes the heating surface, in correspondence with a heating element pattern; and
 sintering the paste to form the heating element.

According to the fifth aspect of the present invention, there is provided a processing apparatus comprising:
 a processing vessel for processing an object to be processed in a predetermined low-pressure atmosphere;
 a heating device, arranged in the processing vessel, for heating the object; and
 process gas supply means for supplying a process gas for processing the object into the processing vessel,
 wherein the heating device includes a heating plate formed of silica and having a heating surface for heating the object, and a heating element having a predetermined pattern and fixed to a surface of the heating plate which opposes the heating surface.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 14 is a bottom view showing a heating plate in the heating device shown in FIG. 12.

DETAILED DESCRIPTION OF THE PREFERRED EMBODIMENTS

A heating device according to the present invention comprises a heating plate for heating an object to be heated, and a heating element arranged on the heating plate. The heating plate formed of silica ($SiO_2$) and has a heating surface for heating the object. The heating element has a predetermined pattern, and is fixed to the surface of the heating plate which opposes the heating surface.

Since the heating plate formed of silica as described above, the heating plate has a corrosion resistance higher than that of a conventional ceramic material of AlN and $Al_2O_3$ and rarely forms particles which cause contamination. In addition, since silica has a small thermal expansion coefficient and a high thermal shock resistance, the heating plate can be abruptly heated or cooled. Since the heating element is fixed to the heating plate, unlike a conventional heating element, the heating element is not cluttered in a groove.

Silica used to form the heating plate preferably has impurities of 10 ppm or less and low alkali metal content in consideration using a semiconductor manufacturing apparatus. The silica constituting the heating plate may be obtained by melting a high-purity silica powder and then cooling it, or may be synthesized from gases. Furthermore, the silica may be glassy, or may partially or entirely have a crystalline state such as quartz.

The heating plate is preferably transparent. Due to this, an object to be heated can be efficiently heated.

A reflecting plate formed of silica as in the heating plate is preferably arranged on the surface of the heating plate which opposes the heating surface with the heating element interposed therebetween. The presence of the reflecting plate suppresses the external heat dissipation from the heating element, and heat reflected by the reflecting plate contributes to heating. For this reason, the object can be more efficiently heated. In this case, the reflecting plate is arranged in tight contact with the heating plate.

As the material of the heating element, for example, platinum (Pt), nickel (Ni), or carbon (C) is available. As the pattern of the heating element, for example, a two-dimensional spherical pattern, a concentrically circular pattern, or a checkerboard pattern for uniform heating is available. This heating element generally generates heat by receiving power is from a power supply.

In order to fix the heating element to the heating plate, a groove corresponding to the pattern of the heating element may be formed in the surface of the heating plate and then filled with the heating element, or the heating element may be bonded to the surface of the heating plate by a proper means. In this case, the heating element can be formed on the surface of the heating plate as a thick-film pattern by screen printing or the like.

Preferred embodiments of the heating device described above will be described below.

Figure 1:
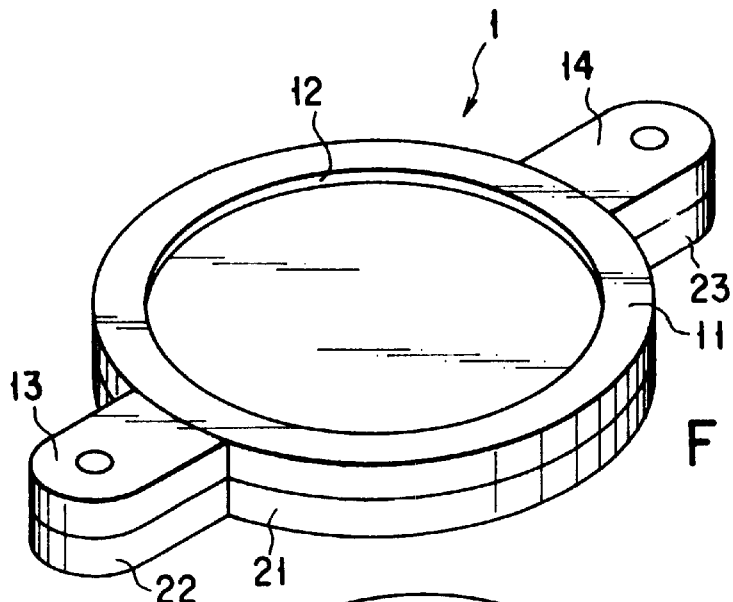
FIG. 1 is a perspective view showing the schematic arrangement of a heating device according to the first embodiment of the present invention.
Figure 2:
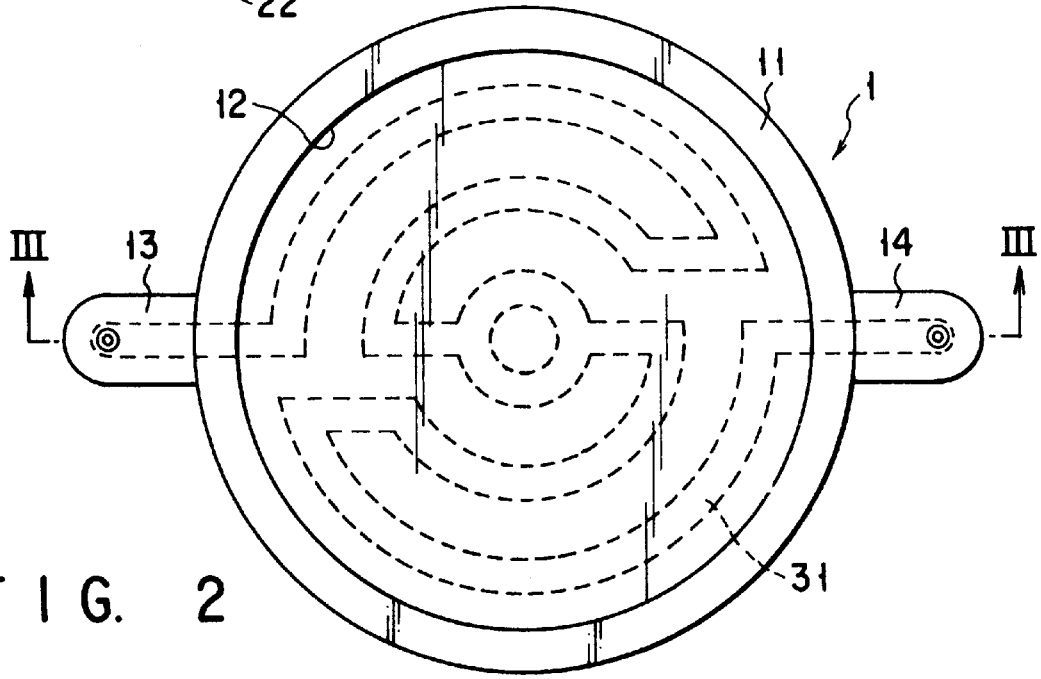
FIG. 2 is a plan view showing the heating device according to the first embodiment of the present invention.
Figure 3:
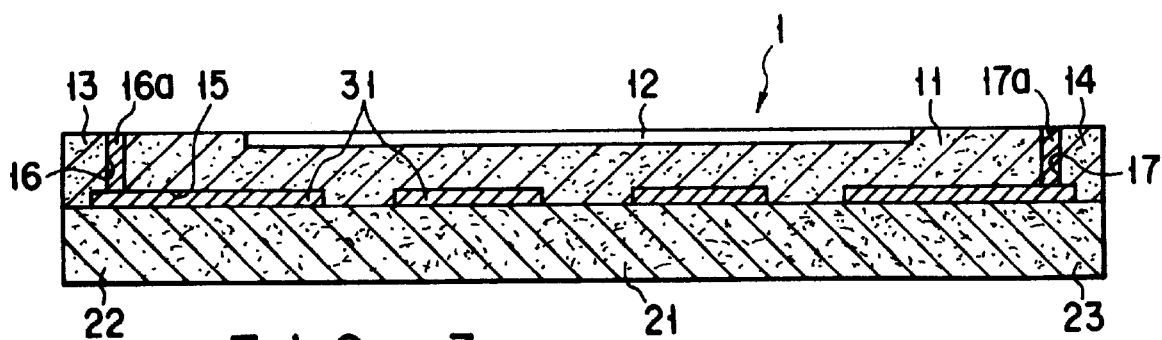
FIG. 3 is a sectional view showing the heating device along a III–III' line in FIG. 2.

FIG. 1 is a perspective view showing the outer appearance of a heating device according to the first embodiment of the present invention, FIG. 2 is a plan view showing the heating device in FIG. 1, and FIG. 3 is a sectional view showing the heating device along a III–III' line in FIG. 2.

As is apparent from FIGS. 1 to 3, a heating device 1 has a disk-like shape as a whole, and includes a heating plate 11 and a reflecting plate 21 having almost the same two-dimensional shape. The heating device 1 is constituted such that the surfaces of the heating plate 11 and the reflecting plate 21 are tightly joined to each other.

The heating plate 11 is formed of transparent silica ($SiO_2$), and has a recessed portion 12 for placing an object to be heated, for example, a semiconductor wafer having a diameter of 8 inches, thereon is formed in the upper surface of the heating plate 11. The upper surface of the recessed portion 12 serves as a heating surface for heating the semiconductor wafer. Radially extended portions 13 and 14 are formed on the circumferential surface of the heating plate 11, and the extended portions 13 and 14 are symmetrically located. These extended portions 13 and 14 are formed of the same material as that of the heating plate 11, i.e., silica ($SiO_2$).

A groove 15 corresponding to the pattern of a heating element is formed in the lower surface of the heating plate 11, and a heating element 31 is filled in the groove 15.

The reflecting plate 21 located on the lower side is formed of opaque silica ($SiO_2$) as a whole. The reflecting plate 21 reflects radiant heat from the heating element 31 airtightly sealed when the reflecting plate 21 is joined to the heating device 1 to the heating plate 11. The reflecting plate 21 conducts heat generated by the heating element 31 to the semiconductor wafer without any loss.

The heating element 31 is formed of platinum and constitutes a so-called heat-generating electrode. When the heating element 31 receives power from external power supply, the heating element 31 generates heat and has a temperature about 1,000° C.

Note that extended portions 22 and 23 corresponding to the extended portions 13 and 14 and having the same two-dimensional shape as that of the extended portions 13 and 14 are arranged on the peripheral surface of the reflecting plate 21, and these extended portions 22 and 23 are tightly joined to the extended portions 13 and 14, respectively.

A method of manufacturing the heating device 1 arranged as described above will be described below.

Figure 4:
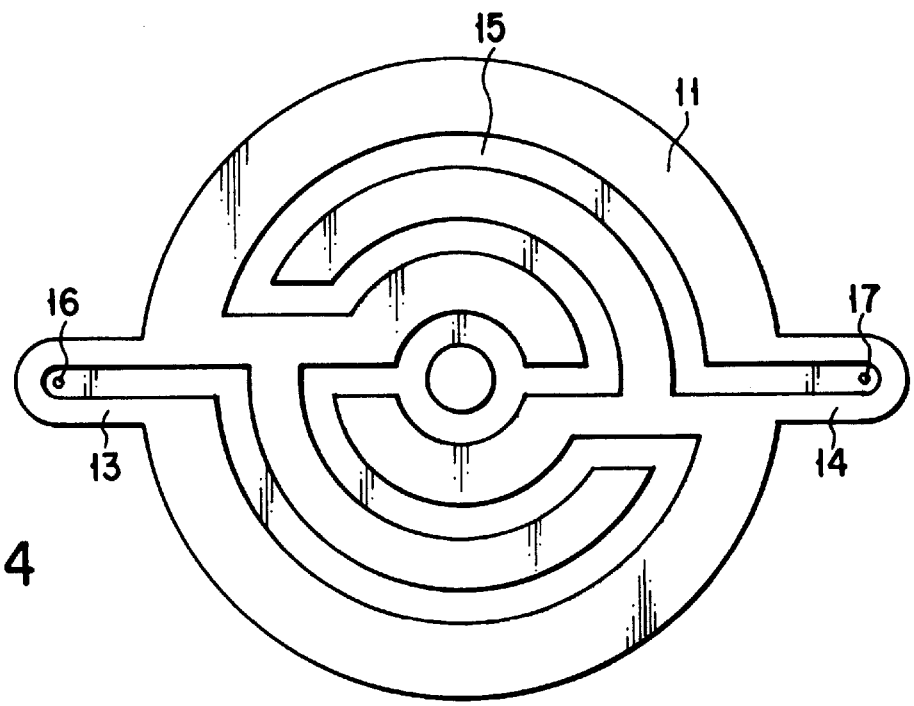
FIG. 4 is a bottom view showing a heating plate in the heating device shown in FIG. 1.
Figure 5:
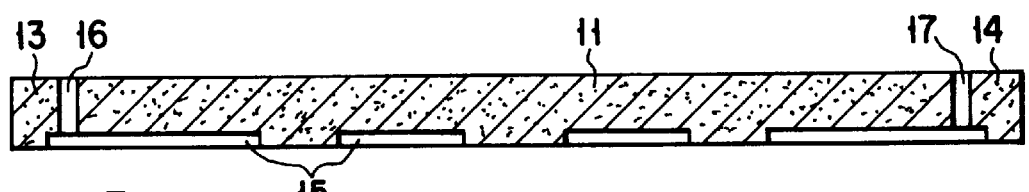
FIGS. 5 to 8 are sectional views for explaining the steps in manufacturing the heating device according to the first embodiment of the present invention.

As shown in FIGS. 4 and 5, a groove 15 corresponding to the heating element pattern and having a predetermined depth is formed in the lower surface of the heating plate 11. The groove 15 can be formed by using, for example, etching. During formation of the groove 15, through holes 16 and 17 vertically extending through the heating plate 11 are formed in the groove 15 portions of the extended portions 13 and 14.

Figure 6:
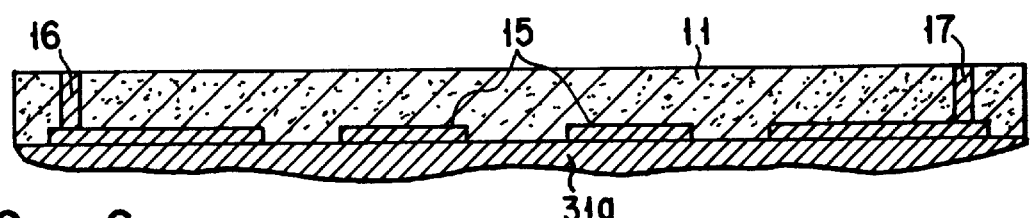

As shown in FIG. 6, a paste 31a for forming the heating element 31, for example, a platinum paste is filled in the groove 15 corresponding to the heating device pattern. At this time, when the paste 31a is filled in the groove 15 while being properly pressed such that the paste-like heat generation material or paste 31a extends to every corner in the groove 15. In addition, the paste 31a is filled in the through holes 16 and 17. However, the through holes 16 and 17 need not be filled with the paste 31a, and the through holes 16 and 17 may be filled with a general conductive material later.

After the paste 31a is filled, the heating plate 11 is burned to evaporate a solvent or the like in the paste 31a, and the paste 11 is sintered to obtain a heating element 31. As described above, since the heating plate 11 is formed of silica ($SiO_2$), a burning temperature is set to be lower than the softening point (1,650° C.) of silica ($SiO_2$), preferably 1100 to 1300° C.

Figure 7:
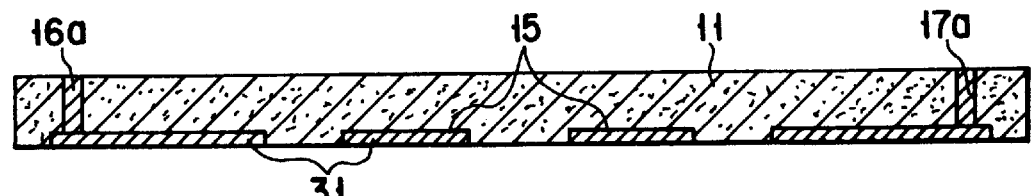

After the burning, as shown in FIG. 7, the upper and lower surfaces of the heating plate 11 are ground by, for example, a surface grinding machine or the like and polished to remove an unnecessary heating element 31, thereby increasing the degree of flatness. In this manner, the heating element 31 is filled and stored in the groove 15 corresponding to the heating element pattern of the heating plate 11. The through holes 16 and 17 are filled with platinum, thereby constituting conductive potions 16a and 17a connected to the heating element 31.

Figure 8:
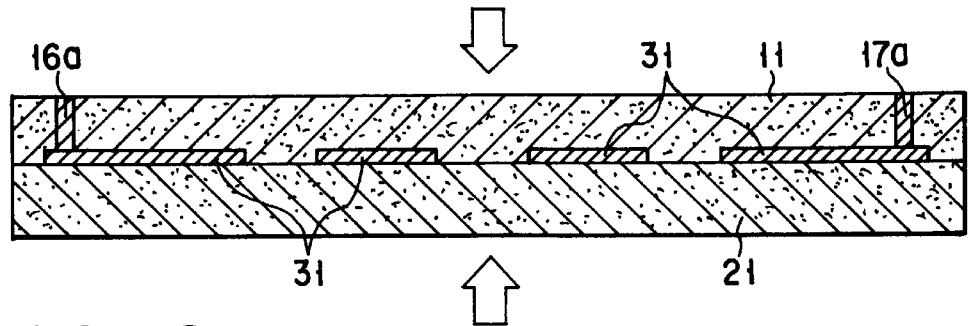

The reflecting plate 21 which is prepared in advance and has surfaces machined to a predetermined degree of flatness is brought into tight contact with the lower surface of the heating plate 11, and the resultant structure is heated to about 1,200° C. in, for example, an electric furnace. In this state, the structure is pressed as shown in FIG. 8 to join the heating plate 11 and the reflecting plate 21 to each other by welding (electrodeposition).

Finally, as shown in FIG. 3, when the recessed portion 12 for storing a semiconductor wafer is formed in the upper surface of the heating plate 11, and the outer shape is adjusted, the heating device 1 is completed.

An example wherein the heating device 1 arranged as described above is applied to a CVD apparatus to perform film formation processing for a surface of a semiconductor wafer will be described below.

Figure 9:
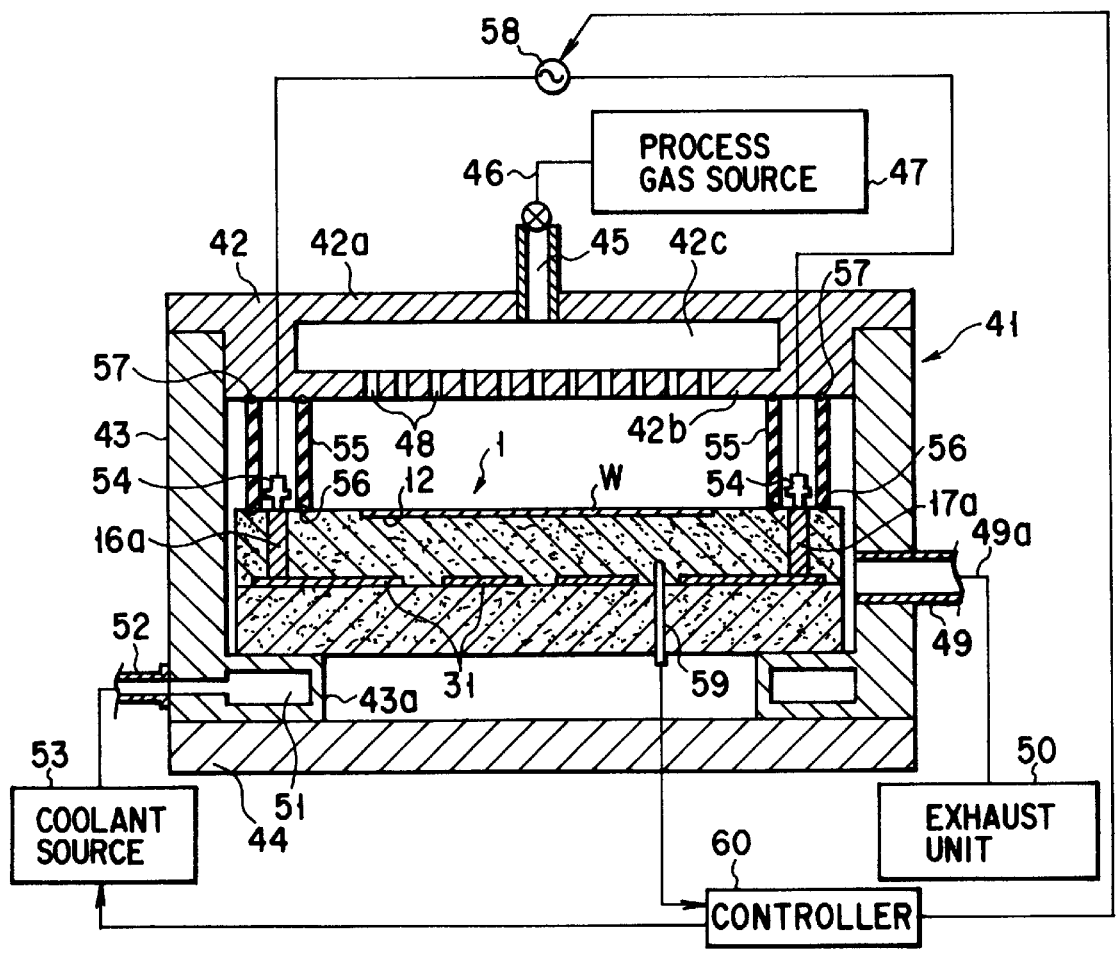
FIG. 9 is a sectional view showing a CVD apparatus to which the heating device according to the first embodiment of the present invention is applied.
Figure 10:
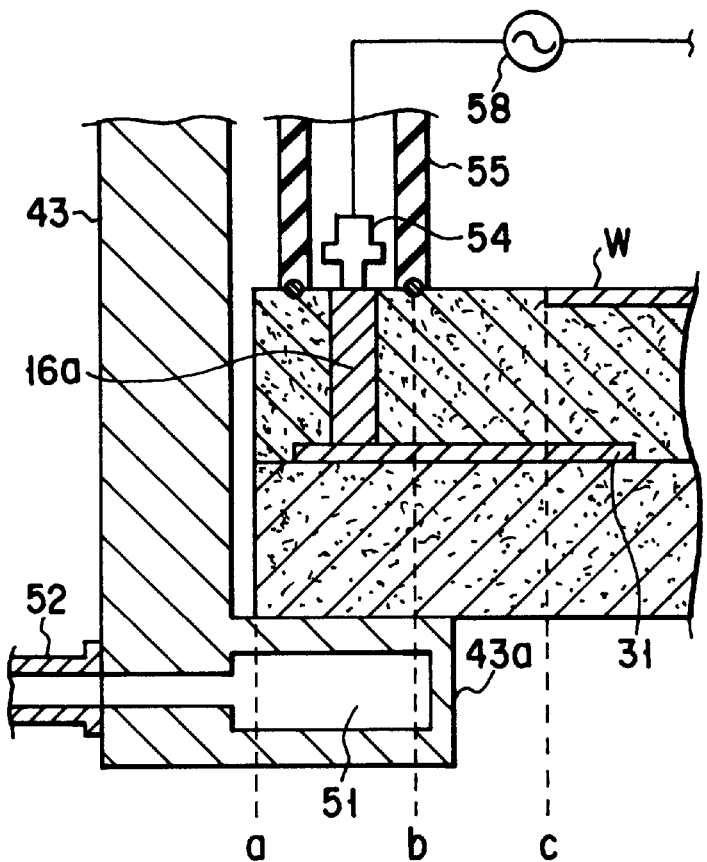
FIG. 10 is an enlarged sectional view showing the main part of the CVD apparatus to which the heating device according to the first embodiment of the present invention is applied.

FIG. 9 is a sectional view showing a CVD apparatus to which the heating device 1 is applied, and FIG. 10 is an enlarged sectional view showing the main part of the CVD apparatus. This CVD apparatus has an almost cylindrical airtight processing vessel 41. The processing vessel 41 is formed of aluminum which is entirely anodized, and is constituted by a shower head 42 serving as the upper portion of the processing vessel 41, a peripheral wall 43, and a bottom wall 44 to have an airtight structure. The above heating device 1, on which a semiconductor wafer W serving as an object to be processed is placed, for heating the semiconductor wafer W is arranged in the processing vessel 41. The semiconductor wafer W is placed on the recessed portion 12 formed in the upper surface of the heating plate 11 of the heating device 1 described above.

The shower head 42 has a hollow disk-like shape. A process gas supply unit 45 is formed in an upper wall 42a of the shower head 42, a large number of gas discharge holes 48 are formed in a lower wall 42b of the shower head 42, and a space 42c is present between the upper wall 42a and the lower wall 42b. A process gas source 47 is connected to the process gas supply unit 45 through a process gas supply pipe 46. A gas mixture of, for example, $SiH_4$ (silane) and $H_2$, is supplied as a process gas from the process gas source 47 to the shower head 42, and the gas mixture is uniformly discharged from the gas discharge holes 48 toward the semiconductor wafer W placed on the heating device 1.

An exhaust hole 49 is formed near the bottom portion of the peripheral wall 43 of the processing vessel 41. An exhaust unit 50 is connected to the exhaust hole 49 through an exhaust pipe 49a. The exhaust unit 50 can keep the inside of the processing vessel 41 to a predetermined degree of vacuum, for example, $10^{-6}$ Torr.

An annular extended portion 43a extended inward is formed on the lower end of the peripheral wall 43 of the processing vessel 41, and the heating device 1 is arranged on the extended portion 43a. That is, the heating device 1 is mounted on the extended portion 43a such that the reflecting plate 21 faces downward. Therefore, the extended portion 43a of the peripheral wall 43 is in contact with the reflecting plate 21.

An annular coolant path 51 is formed in the extended portion 43a, and a coolant source 53 is connected to the coolant path 51 through a coolant supply pipe 52. For example, cooling water serving as a coolant is supplied from the coolant source 53 into the coolant path 51 through the coolant supply pipe 52, and is circulated therethrough. This cooling water can cool the peripheral portions of the conductive potions 16a and 17a of the heating device 1 to about 200° C.

Power supply pins 54 are connected to the upper surfaces of the conductive potions 16a and 17a of the heating device 1, respectively. Cylindrical insulating members 55 are arranged to enclose the power supply pins 54, respectively. The lower end faces of the insulating members 55 are airtightly pressed against the peripheral portions of the conductive potions 16a and 17a of the heating plate 11 through O-rings 56. The upper end faces of the insulating members 55 are airtightly pressed against the lower wall 42b of the shower head 42 through O-rings 57.

An AC power supply 58 arranged outside the processing vessel 41 is connected to the two power supply pins 54. When a predetermined current flows from the AC power supply 58 to the heating element 31 through the power supply pins 54, the heating element 31 generates heat to increase the temperature of the heating device to about 1,000° C. The semiconductor wafer W placed in the recessed portion 12 on the heating plate 11 is heated to have a predetermined temperature.

A temperature sensor 59 for measuring the temperature of a predetermined portion of the heating plate 11 is buried in the heating device 1, and the temperature sensor 59 is connected to a controller 60 through a measurement unit 59a. The measurement unit 59a sequentially measures temperatures on the basis of detection signals from the temperature sensor 59, and signals from the temperature sensor 59 are input to the controller 60. On the basis of these signals, control signals are output from the controller 60 to the AC power supply 58 and the coolant source 53 to adjust an output from the heating element 31 and the flow rate of the cooling water, thereby controlling the temperature of the semiconductor wafer.

In this CVD apparatus, although not shown, lift pins for lifting the semiconductor wafer in conveyance of the semiconductor wafer W are arranged extendibly from the surface of the heating device 1.

In the CVD apparatus arranged as described above, when the AC power supply 58 is turned on, the heating element 31 generates heat to heat the semiconductor wafer W on the heating plate 11. The exhaust unit 50 evacuates the processing vessel 41 to a predetermined degree of vacuum, for example, 1 Torr, and a predetermined process gas, for example, a silane-based gas is supplied into the processing vessel 41. In this manner, a predetermined film, for example, a polysilicon film, is formed on the surface of the semiconductor wafer W.

Figure 11:
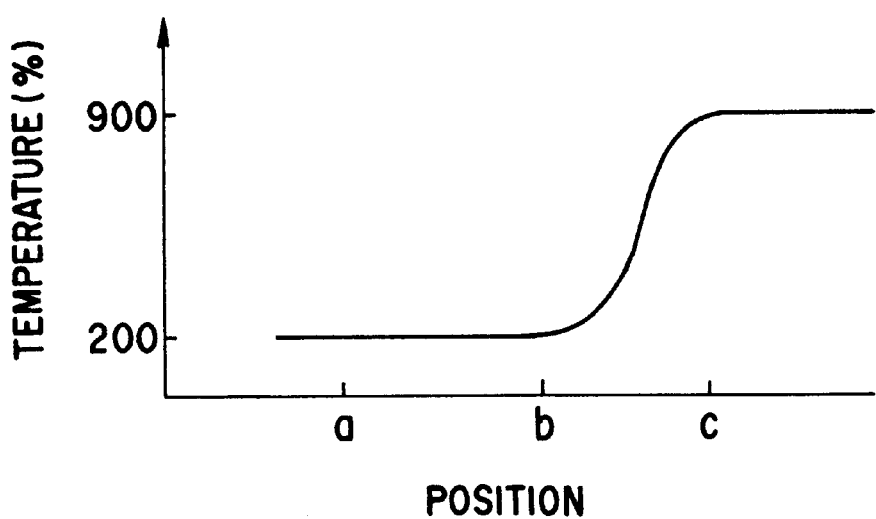
FIG. 11 is a graph showing the temperature distribution of the heating device according to the first embodiment of the present invention.

In this case, since cooling water is circulated in the coolant path 51, a temperature gradient in the heating plate 11 is shown in FIG. 11. More specifically, although the portion of the semiconductor wafer W (the right portion with respect to c in FIGS. 10 and 11) is heated by the heating element 31 to about 900° C., the connection portion between the conductive potion 16a and the power supply pin 54 and a portion around O-rings 56 (the portion between a and b in FIGS. 10 and 11) are cooled to about 200° C.

More specifically, on the heating plate 11, a short-distance portion (the portion between b and c in FIGS. 10 and 11) has a very high temperature gradient. Since the connection portion between the conductive potion 16a and the power supply pin 54 and the O-ring 56 portion have a temperature of about 200° C., the O-rings 56 are not thermally deformed at all, and the inside of the insulating member 55 is kept at a predetermined airtight state. Therefore, even if the outside of the insulating member 55 has a high degree of vacuum, of 1 Torr, the inside of the insulating member 55, i.e., the connection portion between the power supply pin 54 and the conductive potion 16a can be kept in an atmospheric state. For this reason, a power can be supplied to the heating element 31 of the heating device 1 arranged in a state having a high degree of vacuum without any trouble.

As shown in the graph of FIG. 11, the portion on which the semiconductor wafer W is placed is kept at 900° C. which is a predetermined heating temperature. In a practical apparatus, the distance between the inner O-ring 56 and the edge of the semiconductor wafer W (the portion between b and c in FIGS. 10 and 11) is about several cm at most. Although the distance is short as described above, a high temperature gradient is obtained because silica ($SiO_2$) is used as the material of the heating plate 11.

As described above, when the power supply system with the above arrangement is used, a power can be supplied from the power supply in an atmospheric state to the heating device 1 arranged in a high degree of vacuum. In addition, since airtightness is secured by the O-rings, the insulating members 55 can be easily removed from the heating plate 11, and maintenance can be easily performed.

Furthermore, since the semiconductor wafer W is placed on the recessed portion 12 of the heating plate 11, a heat loss is small, and the planar uniformity of the temperature of the semiconductor wafer W is high. For this reason, processing can be uniformed. Since silica has a small thermal expansion coefficient and a high thermal shock resistance, the heating plate is not substantially damaged even if a temperature sharply increases or decreases as described above. Therefore, processing having a large difference in temperature can be continuously performed, and the throughput can be increased.

The second embodiment of the present invention will be described below.

Figure 12:
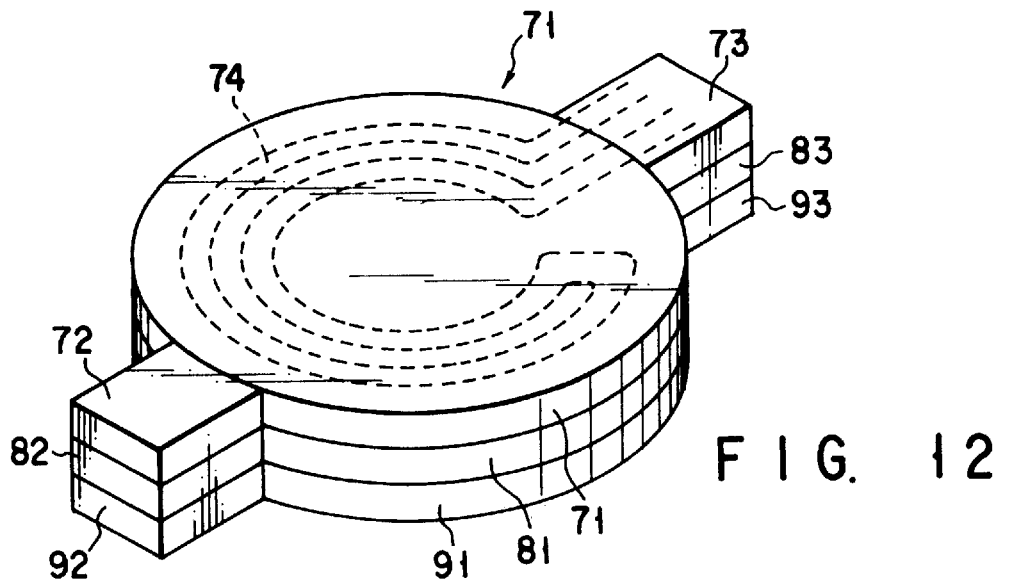
FIG. 12 is a perspective view showing the schematic arrangement of a heating device according to the second embodiment of the present invention.
Figure 13:
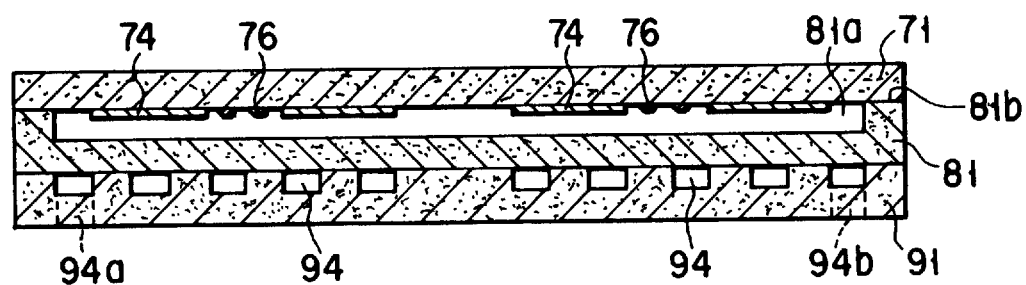
FIG. 13 is a longitudinal sectional view showing the heating device according to the second embodiment of the present invention.

FIG. 12 is a perspective view showing the schematic arrangement of a heating device according to the second embodiment of the present invention, FIG. 13 is a longitudinal sectional view showing the heating device. Like the heating device 1 of the first embodiment, a heating device 61 according to the second embodiment has an almost circular shape as a whole. The heating device 61 has a basic arrangement in which a heating plate 71, a reflecting plate 81, and a cooling member 91 which have almost the same two-dimensional shape are stacked downward.

The heating plate 71 is formed of transparent silica ($SiO_2$), and extended portions 72 and 73 formed of the same material as that of the heating plate 71, i.e., silica ($SiO_2$), are arranged on the circumferential surface of the heating plate 71 such that the extended portions 72 and 73 oppose with respect to the center of the heating plate 71.

As shown in FIG. 14, a heating element 74 formed of platinum (Pt) is bonded to the lower surface of the heating plate 71 to have a thickness of about 10 $\mu$m and an almost C shape as a two-dimensional shape, and end portions 74a and 74b of the heating element 74 are bonded to the extended portion 73. This heating element 74 is formed by, for example, a thick-film pattern, and is designed to generate heat when the heating element 74 receives an AC current from an AC power supply 75.

Around the heating element 74, a temperature measuring resistor 76 formed of platinum (Pt) is joined to the lower surface of the heating plate 71 such that the resistor 76 does not cross the heating element 74 and has a shape similar to the pattern of the heating element 74. End portions 76a and 76b constituting the terminals of the resistor 76 are located at the extended portion 73.

A signal current source 77 for outputting a current having a predetermined value is connected across the end portions 76a and 76b of the resistor 76, and a voltmeter 78 for measuring the voltage of the resistor 76 is connected across the end portions 76a and 76b.

As described above, the reflecting plate 81 with a recessed portion 81a having a depth enough to store the heating element 74 and the temperature measuring resistor 76 is airtightly joined to the lower surface of the heating plate 71 having the heating element 74 and the temperature measuring resistor 76 formed on the lower surface of the heating plate 71, and extended portions 82 and 83 of the reflecting plate 81 and a peripheral portion 81b thereof correspond to the extended portions 72 and 73 and peripheral portion of the heating plate 71, respectively. This reflecting plate 81 is formed of whitish, opaque silica, and has a function of reflecting radiant heat from the heat generator 74 to the heating plate 71.

Note that the depth of the recessed portion 81a of the reflecting plate 81 is set to form a gap having, for example, about 100 $\mu$m, between the lower surface of the heating element 74 and the bottom surface of the recessed portion 81a. In this manner, when the small gap is formed, diffusion of heat conducted from the heating element 74 can be suppressed, thereby improving heating efficiency.

The cooling member 91 airtightly joined to the lower surface of the reflecting plate 81 has extended portions 92 and 93 arranged to correspond to the extended portions 82 and 83, and is formed of silica like the heating plate 71 and the reflecting plate 81. A groove 94 constituting a flow path for a cooling gas is formed in the upper surface of the cooling member 91, and both end portions 94a and 94b of the groove 94 are open to the lower surface of the cooling member 91.

Figure 15:
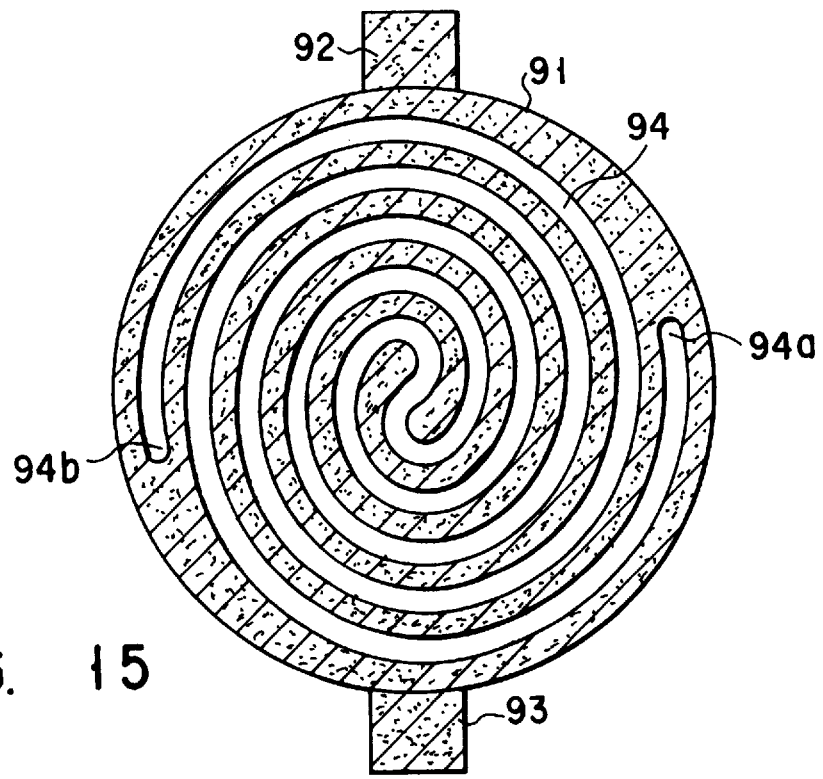
FIG. 15 is a horizontal sectional view showing a cooling member used in the heating device according to the second embodiment of the present invention.

More specifically, as shown in FIG. 15, the groove 94 has a pattern such that the end portions 94a and 94b spirally extend toward the center of the cooling member 91 to be connected to each other at the central portion, and the groove 94 has no cross portion halfway and is not eccentric with respect to the reflecting plate 81. Therefore, when a cooling gas such as $N_2$ gas (nitrogen gas) flows in the groove 94, the gas is brought into contact with the lower surface of the reflecting plate 81, and heat exchange is performed at the contact portion, thereby cooling the reflecting plate 81.

The heating device 61 with the above arrangement is manufactured as follows. The pattern of the heating element 74 and the pattern of the temperature measuring resistor 76 are formed on a screen printing plate in advance. A platinum powder for forming the heating element 74 and the resistor 76, an organic binder, and an organic solvent are mixed with each other to form a paste. This paste is screen-printed on the lower surface of the heating plate 71 using the screen printing plate. More specifically, the paste-like heating element 74 and the paste-like resistor 76 are simultaneously formed on the lower surface of the heating plate 71 by a thick-film printing method. When these films are simultaneously sintered, the heating element 74 having the predetermined pattern and the temperature measuring resistor 76 having the predetermined pattern are formed to be bonded to the lower surface of the heating plate 71.

Thereafter, the reflecting plate 81 is brought into tight contact with the heating plate 71, and the cooling member 91 is brought into contact with the plate 81, and simultaneously pressed and heated to be integrated. As a matter of course, after the reflecting plate 81 and the heating plate 71 are brought into tight contact with each other, pressed, and heated, the cooling member 91 may be brought into tight contact with the resultant structure, pressed, and heated. As described above, the heating device 61 can be easily manufactured at a high speed.

According to the heating device 61 having the above arrangement, since the heating plate 71, the reflecting plate 81, and the cooling member 91 are formed of silica, they have a corrosion resistance higher than that of a conventional ceramic material, and particles which cause contamination are rarely formed. The presence of the reflecting plate 81 makes the heating efficiency are formed by the heating element 74 high. In addition, since the heating plate 71 and the reflecting plate 81 consist of silica, they have a small thermal expansion coefficient and a high thermal shock resistance, and can be abruptly heated or cooled. Therefore, when semiconductor wafers are to be heated, the throughput of the semiconductor wafers can be increased. Since the reflecting plate 81 is cooled by the cooling member 91, such an abrupt increase/decrease in temperature can be easily realized.

In a heating device of this type, a temperature must be always measured to control the temperature. Conventionally, a sheath-like thermocouple is generally inserted in a hole formed in, for example, a heating plate. However, according to the measurement method described above, a countermeasure against particles formed by the thermocouple is cumbersome, and the manufacture and processing of the heating plate itself are cumbersome. In addition, since the measurement method uses one representative measurement point, a plurality of thermocouples are required to measure the average temperature of the entire heating plate.

With respect to this point, in the heating device 61 according to the second embodiment, the temperature measuring resistor 76 is arranged around the heating element 74. When the voltage obtained by the signal current source 77 is always measured, the average temperature of the entire heating plate 71 can be measured. More specifically, by using a change in resistance of the resistor 76 caused by a change in temperature, the temperature of the heating plate 71 can be calculated on the basis of the prepared temperature-resistance correlation data of the resistor 76 and a change in resistance calculated on the basis of a change in voltage.

Furthermore, since the resistor 76 is arranged in correspondence with the pattern of the heating element 74, the average temperature of the entire heating plate 71 based on the temperature of the heating element 74 can be measured.

When the temperature measuring resistor 76 is to be formed on the heating plate 71, the resistor 76 and the heating element 74 can be simultaneously formed by screen printing. For this reason, the resistor 76 can be easily formed, and the heating plate 71 itself need not be processed.

In the heating device 61, the heating element 74 and the temperature measuring resistor 76 are arranged not to cross each other. However, when a thin insulating film is formed on the lower surface of, for example, the heating element 74, and the resistor 76 is formed on the lower surface of the insulating film, the temperature measuring resistor 76 can be formed to have an arbitrary pattern suitable for a temperature measuring operation.

An object to be heated need not be placed on a heating plate, and the object may be located at a position where the object can be heated by the heating surface of the heating plate. In addition, a processing apparatus to which the heating device according to the present invention is applied is not limited to a CVD apparatus, and the heating device may be applied to another apparatus such as an apparatus for performing oxidation and diffusion.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A heating device comprising:
   a heating plate formed of silica and having a heating surface for heating an object to be heated, wherein the heating surface has a recessed portion on which the object is placed; and
   a heating element having a predetermined pattern and fixed to a surface of said heating plate which opposes the heating surface.

2. The heating device according to claim 1, wherein said heating plate is transparent.

3. The heating device according to claim 1, wherein said heating plate is formed of one of molten silica and synthetic silica.

4. The heating device according to claim 1, wherein the object is placed on the heating surface.

5. The heating device according to claim 1, wherein the surface of said heating plate which opposes the heating surface has a recessed portion having a pattern corresponding to a pattern of said heating element, and said heating element is filled in the recessed portion.

6. The heating device according to claim 1, wherein said heating element is bonded to the surface of said heating plate which opposes the heating surface.

7. The heating device according to claim 6, wherein said heating element has a thick-film pattern.

8. The heating device according to claim 1, further comprising a heat measuring resistor arranged around said heating element.

9. A heating device comprising:
- a heating plate formed of silica and having a heating surface for heating an object to be heated; and
- a heating element having a predetermined pattern and fixed to a surface of said heating plate which opposes the heating surface;
- the device further comprising a power supply for supplying a power to said heating element, a conductive portion for electrically connected said heating element to an outside of said heating device, a power-supply member, electrically connected to said conductive portion, for supplying a power from said power supply to said heating element through said conductive portion, an insulating member which surrounds an area including a connection portion between said conductive portion and said power supply member and uses an internal space of the area as an airtight space isolated from the outside, and cooling means for cooling the connection portion.

10. The heating device according to claim 9, further comprising a seal member for assuring airtightness in said insulating member, and wherein said insulating member is brought into tight contact with the surface of said heating plate through said seal member.

11. A heating device comprising:
- a heating plate formed of transparent silica and having a heating surface for heating an object to be heated;
- a heating element having a predetermined pattern and fixed to a surface of said heating plate which opposes the heating surface; and
- a reflecting plate formed of opaque silica and brought into tight contact with the surface of said heating plate on which said heating element is formed.

12. The heating device according to claim 11, wherein said heating plate is transparent.

13. The heating device according to claim 11, wherein said heating plate is formed of one of molten silica and synthetic silica.

14. The heating device according to claim 11, wherein the object is placed on the heating surface.

15. The heating device according to claim 14, wherein the heating surface has a recessed portion on which the object is placed.

16. The heating device according to claim 11, wherein the surface of said heating plate which opposes the heating surface has a recessed portion having a pattern corresponding to a pattern of said heating element, and said heating element is filled in the recessed portion.

17. The heating device according to claim 11, wherein said heating element is bonded to the surface of said heating plate which opposes the heating surface.

18. The heating device according to claim 17, wherein said heating element has a thick-film pattern.

19. The heating device according to claim 11, further comprising a heat measuring resistor arranged around said heating element.

20. A heating device comprising:
- a heating plate formed of silica and having a heating surface for heating an object to be heated;
- a heating element having a predetermined pattern and fixed to a surface of said heating plate which opposes the heating surface; and
- a reflecting plate formed of silica and brought into tight contact with the surface of said heating plate on which said heating element is formed;
- the device further comprising a power supply for supplying a power to said heating element, a conductive portion for electrically connecting said heating element to an outside of said heating device, a power supply member, electrically connected to said conductive portion, for supplying a power from said power supply to said heating element through said conductive portion, an insulating member which surrounds an area including a connection portion between said conductive portion and said power supply member and uses an internal space of the area as an airtight space isolated from the outside, and cooling means for cooling the connection portion.

21. The heating device according to claim 20, further comprising a seal member for assuring airtightness in said insulating member, and wherein said insulating member is brought into tight contact with the surface of said heating plate through said seal member.

22. The heating device according to claim 11, further comprising a cooling member which is arranged in tight contact with a surface of said reflecting plate which opposes a surface contacting said heating plate, and has a coolant flow path formed therein.

23. A method of manufacturing a heating device, comprising the steps of:
- preparing a heating plate formed of silica and having a heating surface for heating an object to be heated;
- forming a recessed portion corresponding to a pattern of a heating element in the surface of said heating plate which opposes the heating surface;
- filling a paste containing a heating element component in said recessed portion; and
- sintering the paste to form said heating element.

24. The method according to claim 23, further comprising the step of removing a heating element extending from said recessed portion, and the step of bringing a reflecting plate formed of silica into tight contact with the surface of said heating plate on which said heating element is formed.

25. The method according to claim 23, further comprising the step of forming a temperature measuring resistor around said heating element on the surface of said heating plate on which said heating element is formed.

26. The method according to claim 23, further comprising the step of forming a recessed portion for placing the object thereon on the heating surface of said heating plate.

27. The method according to claim 26, further comprising the step of bringing a cooling member having a coolant flow path formed therein into tight contact with a surface of said reflecting plate which opposes the surface contacting said heating plate.

28. A method of manufacturing a heating device, comprising the steps of:

preparing a heating plate formed of silica and having a heating surface for heating an object to be heated;

applying a paste containing a heating element component to a surface of said heating plate which opposes the heating surface, in correspondence with a heating element pattern;

sintering the paste to form said heating element; and the method further comprising forming a recessed portion for placing the object thereon on the heating surface of said heating plate.

29. A method of manufacturing a heating device, comprising the steps of:

preparing a heating plate formed of silica and having a heating surface for heating an object to be heated;

applying a paste containing a heating element component to a surface of said heating plate which opposes the heating surface, in correspondence with a heating element pattern; and sintering the paste to form said heating element;

the method further comprising the step of bringing a reflecting plate formed of silica and having a recessed portion which can store said heating element into tight contact with a surface of said heating plate on which the heating element is formed.

30. A method of manufacturing a heating device, comprising the steps of:

preparing a heating plate formed of silica and having a heating surface for heating an object to be heated;

applying a paste containing a heating element component to a surface of said heating plate which opposes the heating surface, in correspondence with a heating element pattern; and sintering the paste to form said heating element;

the method further comprising the step of forming a temperature measuring resistor around said heating element on a surface of said heating plate on which said heating element is formed.

31. The method according to claim 28, further comprising the step of bringing a cooling member having a coolant flow path formed therein into tight contact with a surface of said reflecting plate which opposes the surface contacting said heating plate.

32. A processing apparatus comprising:

a processing vessel for processing an object to be processed in a predetermined low-pressure atmosphere;

a heating device, arranged in said processing vessel, for heating the object; and process gas supply means for supplying a process gas for processing the object into said processing vessel, wherein said heating device includes a heating plate formed of silica and having a heating surface for heating the object, and a heating element having a predetermined pattern and fixed to a surface of said heating plate which opposes the heating surface, and wherein the heating surface of said heating device has a recessed portion on which the object to be heated is placed.

33. The apparatus according to claim 32, wherein said heating plate of said heating device is transparent.

34. The apparatus according to claim 32, wherein said heating plate of said heating device is formed of one of molten silica and synthetic silica.

35. The apparatus according to claim 32, wherein the object to be processed is placed on the heating surface of the heating device.

36. The apparatus according to claim 32, wherein the surface of said heating plate of said heating device which opposes the heating surface has a recessed portion having a pattern corresponding to a pattern of said heating element, and said heating element is filled in the recessed portion.

37. The apparatus according to claim 32, wherein said heating element of said heating device is bonded to the surface of said heating plate which opposes the heating surface.

38. The apparatus according to claim 37, wherein said heating element of said heating device has a thick-film pattern.

39. The apparatus according to claim 32, wherein said heating device further comprises a heat measuring resistor arranged around said heating element.

40. A processing apparatus comprising:

a processing vessel for processing an object to be processed in a predetermined low-pressure atmosphere;

a heating device, arranged in said processing vessel, for heating the object; and process gas supply means for supplying a process gas for processing the object into said processing vessel, wherein said heating device includes a heating plate formed of silica and having a heating surface for heating the object, and a heating element having a predetermined pattern and fixed to a surface of said heating plate which opposes the heating surface;

wherein said heating device further comprises a power supply for supplying a power to said heating element, a conductive portion for electrically connected said heating element to an outside of said heating device, a power supply member, electrically connected to said conductive portion, for supplying a power from said power supply to said heating element through said conductive portion, an insulating member which surrounds an area including a connection portion between said conductive portion and said power supply member and uses an internal space of the area as an airtight space isolated from the outside, and cooling means for cooling the connection portion.

41. The apparatus according to claim 40, wherein said heating device further comprises a seal member for assuring airtightness in said insulating member, and said insulating member is brought into tight contact with the surface of said heating plate through said seal member.

42. The apparatus according to claim 32, wherein said heating device further comprises a reflecting plate consisting of silica and brought into tight contact with the surface of said heating plate on which said heating element is formed.

43. The apparatus according to claim 42, wherein said reflecting plate of said heating device is opaque.

44. The apparatus according to claim 42, wherein said heating device further comprises a cooling member which is arranged in tight contact with a surface of said reflecting plate which opposes a surface contacting said heating plate, and has a coolant flow path formed therein.

* * * * *

UNITED STATES PATENT AND TRADEMARK OFFICE
CERTIFICATE OF CORRECTION

PATENT NO. : 5,904,872

DATED : May 18, 1999

INVENTOR(S): Junichi ARAMI, et al.

It is certified that an error appears in the above-identified patent and that said Letters Patent is hereby corrected as shown below:

On the title page, item [75], the first and third inventors' addresses are incorrect. They should be:

--Junichi ARAMI, Tokyo, Japan--
--Harunori USHIKAWA, Sagamihara     Japan--

Signed and Sealed this

Twentieth Day of June, 2000

Attest:

Q. TODD DICKINSON

Attesting Officer        Director of Patents and Trademarks